United States Patent [19]
Wang et al.

[11] Patent Number: 6,010,938
[45] Date of Patent: Jan. 4, 2000

[54] METHOD FOR MAKING A LOAD RESISTOR ON A SEMICONDUCTOR CHIP

[75] Inventors: Ting-Sing Wang, Hsin-Chu Hsien; Chon-Shin Jou, Tainan; Kuan-Chou Sung, Taoyuan, all of Taiwan

[73] Assignee: Mosel Vitelic Inc., Hsin-Chu, Taiwan

[21] Appl. No.: 09/192,018

[22] Filed: Nov. 11, 1998

[51] Int. Cl.⁷ .................................................. H01L 21/00
[52] U.S. Cl. ............................................ 438/384; 438/382
[58] Field of Search ................................... 438/238, 382, 438/384

[56] References Cited

U.S. PATENT DOCUMENTS 5,141,597   8/1992   Adams et al. ........................... 156/628

*Primary Examiner*—Olik Chaudhuri
*Assistant Examiner*—Ginette Peralta
*Attorney, Agent, or Firm*—Winston Hsu

[57] ABSTRACT

The present invention provides a new method for making a load resistor in a semiconductor chip. According to the new method, a linear-shaped doped polysilicon layer is formed onto the surface of the semiconductor chip that comprises a Si substrate and an NSG layer. This layer functions as a conductive path. A slot is formed in this layer by removing a section from the conductive path. This slot reaches down to the NSG layer effectively cutting off the polysilicon layer. Then, a rugged polysilicon layer is evenly deposited onto the surface of the slot for connection of the conductive path. The polysilicon layer over the slot and the doped polysilicon layer defines the load resistor. The result is a high resistance value with usage of only a small space.

11 Claims, 3 Drawing Sheets

METHOD FOR MAKING A LOAD RESISTOR ON A SEMICONDUCTOR CHIP

BACKGROUND OF THE INVENTION

1. Field of the Invention

The present invention relates to a method for making a load resistor on a semiconductor chip.

2. Description of the Prior Art

Resistors with high resistance on a semiconductor chip are usually made of polysilicon, such as resistors made in static random access memory (SRAM). Resistors made of polysilicon are used to replace load transistors in SRAM in order to reduce the number of transistors. Such method can save production costs and maximize circuit integration.

Please refer to FIGS. 1 and 2. FIGS. 1 and 2 show a prior art method for making a load resistor on a semiconductor chip 10. The surface of the semiconductor chip 10 comprises a Si substrate 12, a neutral silicate glass (NSG) layer 14 deposited on the Si substrate 12 for functioning as an insulation layer and a line-shaped polysilicon layer 16 deposited on the NSG layer 14 used as a conductive path. As shown in FIG. 1, ion implantation of As ions is performed to lightly dope the polysilicon layer 16 on the surface of the semiconductor chip 10 to eliminate defects and to average out the resistance value of the polysilicon layer 16.

Please refer to FIG. 2. By using photolithographic and etching techniques, an optical resistance 18 is formed on the surface of the polysilicon layer 16 for acting as a mask or sacrificial layer in the ion implantation process. In the ion implantation process, the polysilicon layer 16 of the surface of the semiconductor chip 10 is doped with P ions to reduce the resistance value of the entire polysilicon layer 16 and to make the polysilicon layer 16 an electric conductor. The area 20 of the polysilicon that is covered by the optical resistance 18 forms a load resistor with relatively high resistance.

However, in order to achieve high resistance (about a few hundred GΩ) in an integrated circuit, the deposited polysilicon must be very large. If the shallow trenches measure less than 0.25 μm in width, the load resistor may become too large and will occupy a lot of space.

SUMMARY OF THE INVENTION

It is therefore a primary objective of the present invention to provide a method for making a load resistor in a semiconductor chip to solve the above mentioned problem and simplify the prior art process of making a load resistor.

In a preferred embodiment, the present invention provides a method for making a load resistor in a semiconductor chip comprising:

(1) making a conductive path by forming a line-shaped doped polysilicon layer on the surface of a semiconductor chip;

(2) removing one section of the conductive path and forming a slot; and (3) forming a rugged polysilicon layer on the surface of the slot to connect the conductive path which defines the load resistor.

It is an advantage of the present invention that the load resistor manufacturing method according to the present invention not only simplifies the prior art load resistor manufacturing process, but also reduces the area occupied by the load resistor on the surface of the semiconductor chip.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
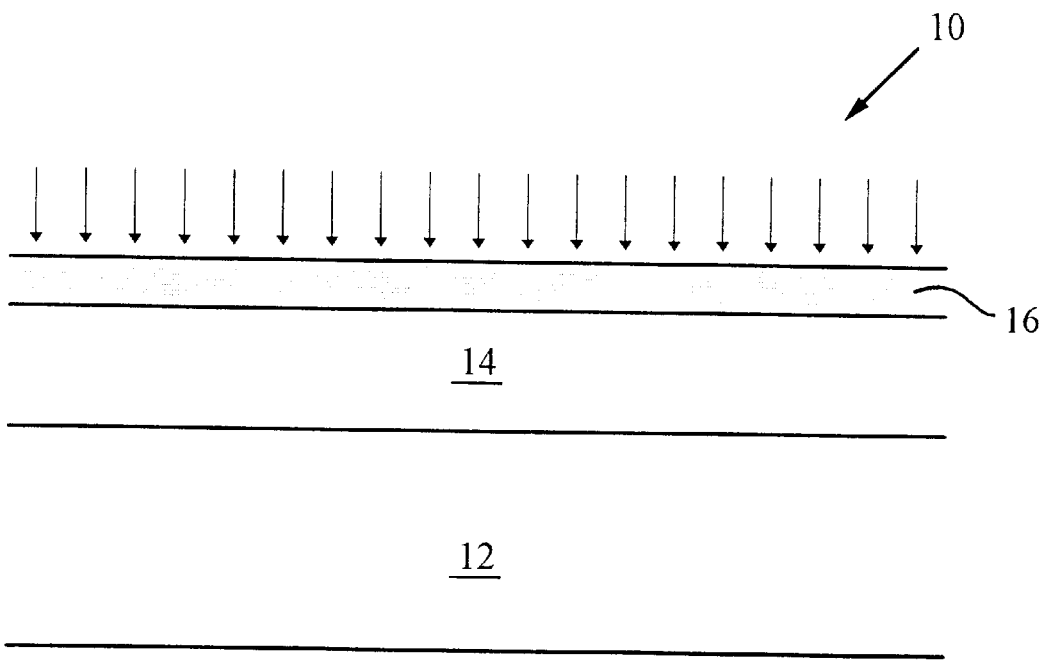
FIGS. 1 and 2 show a prior art method for making a load resistor in a semiconductor chip.
Figure 2:
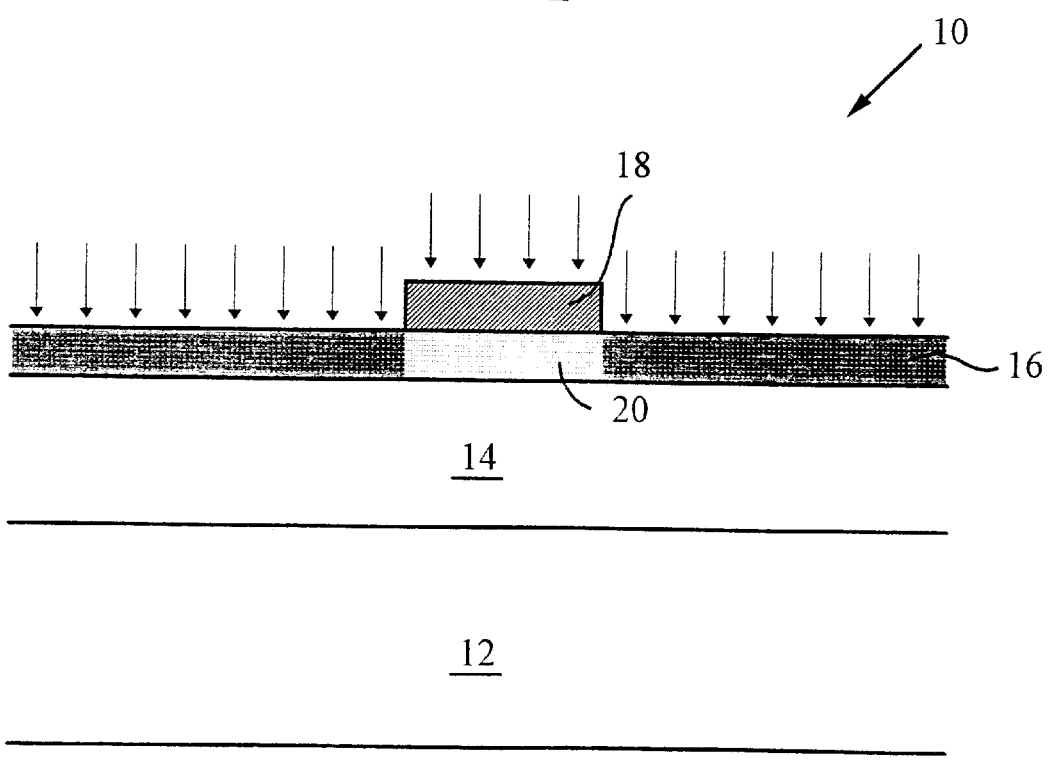
Figure 3:
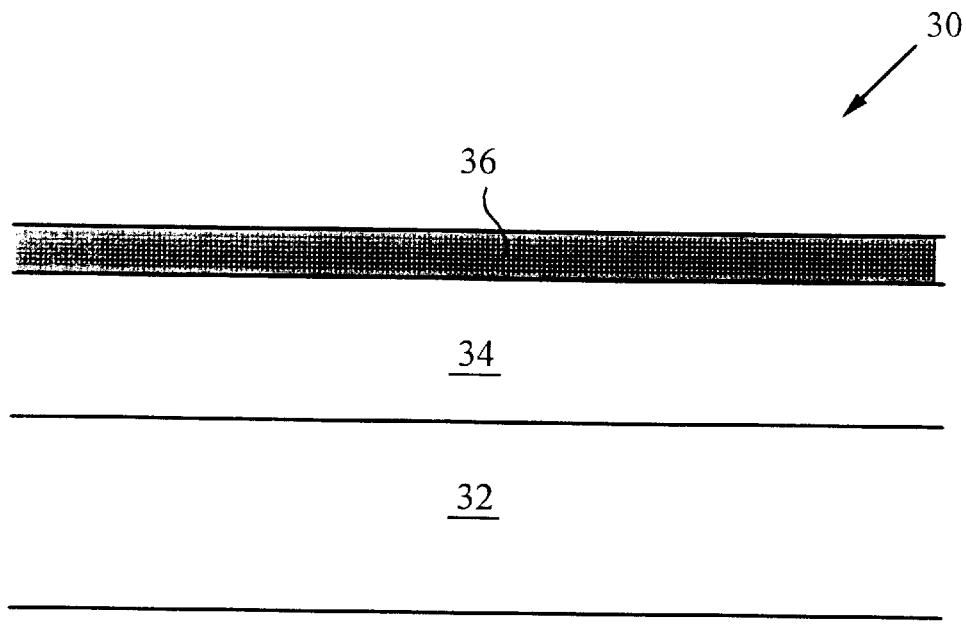
FIGS. 3 to 5 show a method for making a load resistor in a semiconductor chip according to the present invention.
Figure 4:
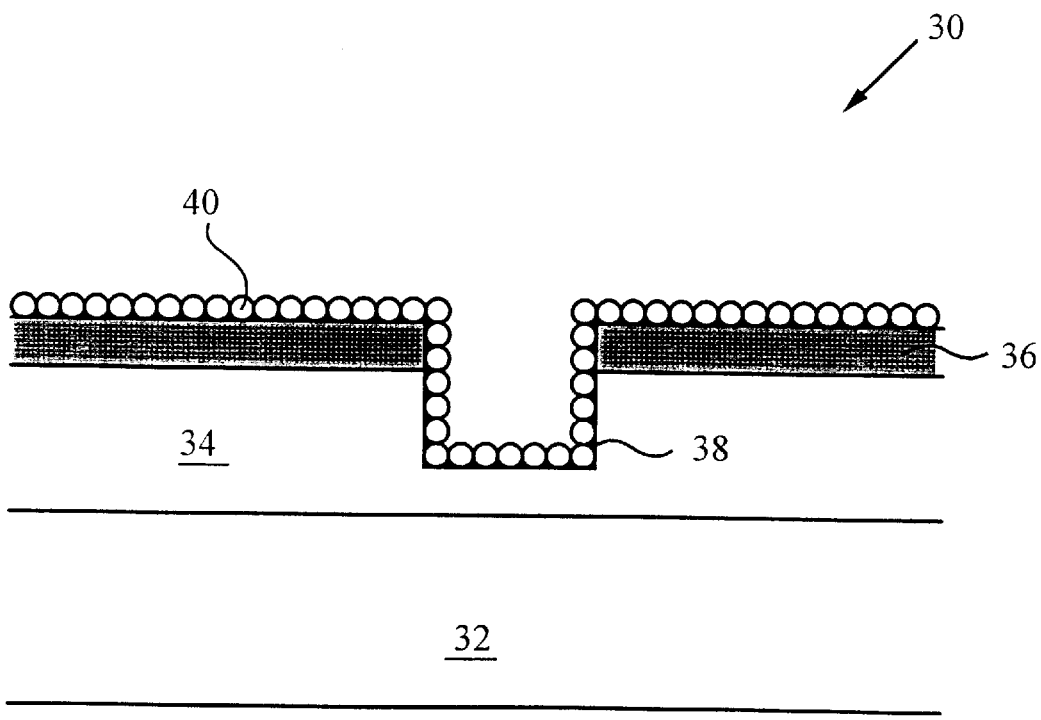
Figure 5:
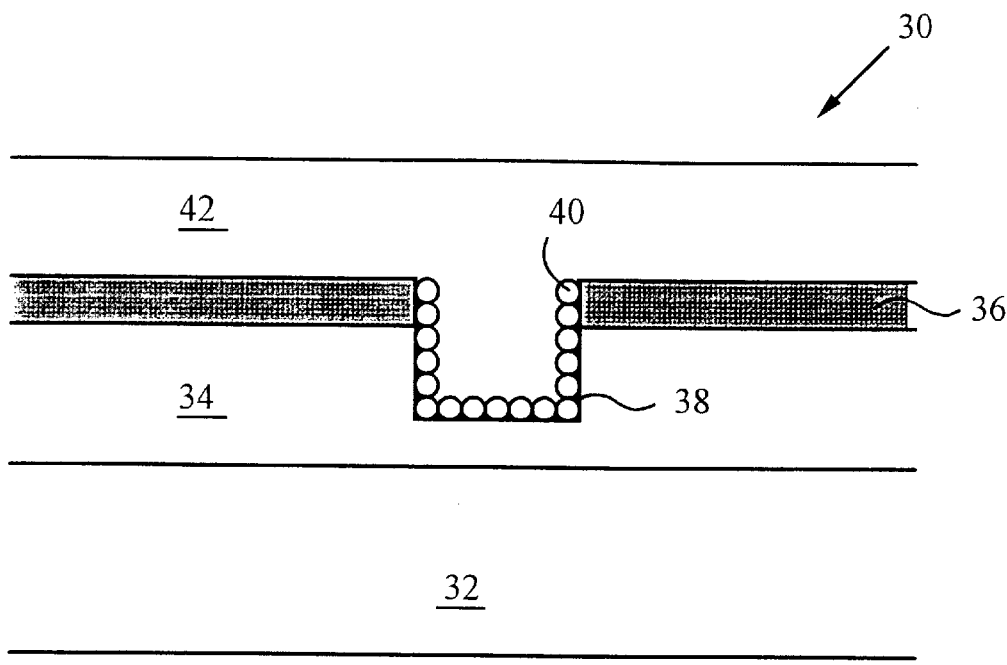

Please refer to FIGS. 3 to 5. FIGS. 3 to 5 illustrate a method for making a load resistor on a semiconductor chip according to the present invention. The surface of the semiconductor chip 30 comprises a Si substrate 32 and a NSG layer 34 deposited on the Si substrate 32 for functioning as an insulation layer. First, as shown in FIG. 3, a line-shaped polysilicon layer is deposited onto the NSG layer 34 while P ions are doped into the polysilicon layer. The polysilicon layer functions as a conductive path.

As shown in FIG. 4, by using photolithographic and etching processes, a slot 38 is formed on the surface of the line-shaped doped polysilicon layer 36 ensuring that the slot 38 reaches the NSG layer 34 to cut off the doped polysilicon layer 36. Then, by using a low pressure chemical vapor deposition method, a rugged polysilicon layer 40 is deposited over the surface of the semiconductor chip 30 at a temperature between 550 to 650° C. to make a thin rugged polysilicon layer 40 that evenly covers the surface of the slot 38.

As shown in FIG. 5, using a chemical mechanical polishing method or an etch back process, the rugged polysilicon layer 40 is stripped from the surface of the semiconductor chip 30 but the connection between the rugged polysilicon layer 40 and the doped polysilicon layer 36 is preserved. Finally, an insulation layer 42 is formed on the surface of the semiconductor chip 30 over the doped polysilicon layer 36 and rugged polysilicon layer 40. Thus, the load resistor on the semiconductor chip is formed from the rugged polysilicon layer 40 over the slot 38 and the section of the doped polysilicon layer 36.

The rugged polysilicon layer 40 is a poor conductor; however, tiny crystals formed by the rugged polysilicon layer 40 greatly increase the grain boundary. Therefore, the resistance value of the load resistor formed by the rugged polysilicon layer 40 according to the present invention is greater than that of the load resistor formed by the non-doped polysilicon in the prior art method. In other words, with the same resistance value, the area occupied by the load resistor according to the present invention is smaller than the area occupied by the load resistor formed by the prior art method. Additionally, the design of the slot structure reduces the area required by the load resistor. Controlling the temperature of LPCVD to control the size of the crystals of the rugged polysilicon layer 40 according to the present invention enables control of the resistance of the load resistor. For example, a temperature between 550 to 650° C. for depositing the rugged poly-silicon layer 40 results in a resistivity of the load resistor greater than $10^9$ ohm (Ω).

Figure 6:
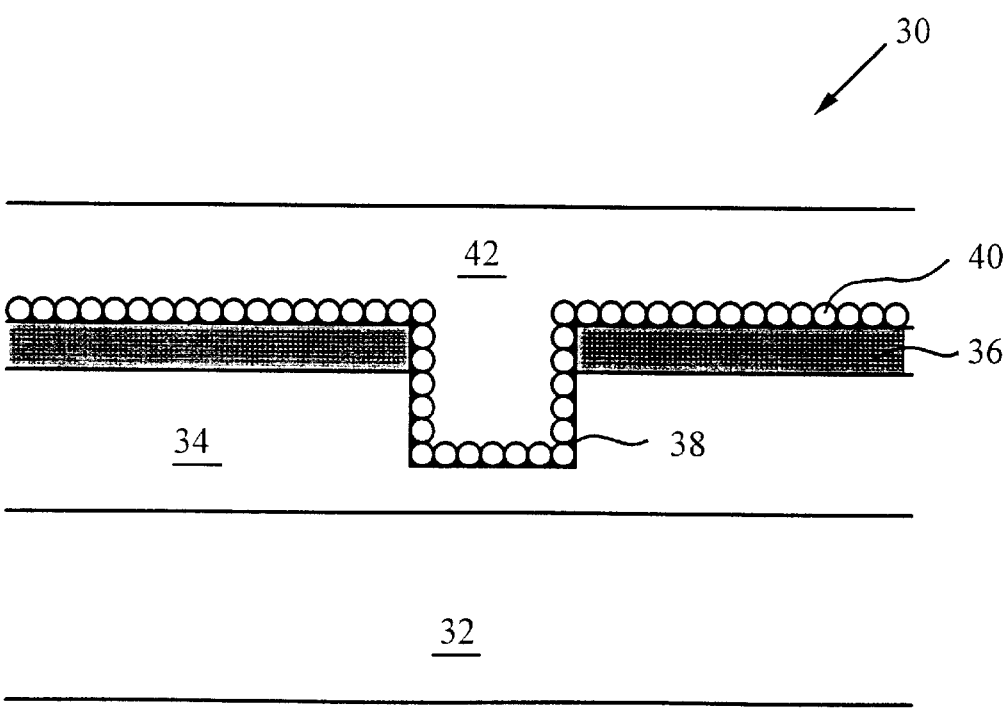
FIG. 6 shows another method for making a load resistor according to the present invention.

Please refer to FIG. 6. FIG. 6 shows another method for making a load resistor according to the present invention. As shown in FIG. 4, after deposition of the line-shaped rugged polysilicon layer 40, an insulation layer 42 is deposited over the doped polysilicon layer 36 and rugged polysilicon layer 40 to form the load resistor on a semiconductor chip 50 according to the present invention. Because electric current will always choose the shortest path with the least resistance, the rugged polysilicon layer 40 outside of the slot 38 will be preserved. Thus, a chemical mechanical polishing method or an etch back process can be avoided.

Compared with the prior art method for making a load resistor, the method according to the present invention is greatly simplified, as it does not require two ion implantation processes. Additionally, the area occupied by the load resistor is reduced which promotes the integration of the semiconductor chip.

The above disclosure is not intended as limiting. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making a load resistor in a semiconductor chip comprising:

(1) making a conductive path by forming a line-shaped doped polysilicon layer on the surface of a semiconductor chip;

(2) removing one section of the conductive path and forming a slot; and (3) forming a rugged polysilicon layer on the surface of the slot to connect the conductive path which defines the load resistor.

2. The method of claim 1 wherein the line-shaped doped polysilicon layer is formed above an insulating layer.

3. The method of claim 2 wherein the insulating layer is a neutral silicate glass (NSG) layer.

4. The method of claim 1 further comprising the following step:

forming an insulating layer on the surface of the semiconductor chip to cover the line-shaped doped polysilicon layer and the rugged polysilicon layer.

5. The method of claim 1 wherein the slot is formed by photolithographic and etching processes.

6. The method of claim 1 wherein the rugged polysilicon layer is deposited on the surface of the slot by using a low pressure chemical vapor deposition method.

7. The method of claim 6 wherein the temperature for depositing the rugged polysilicon layer is around 550 to 650° C.

8. The method of claim 6 further comprising the following step:

removing the rugged polysilicon layer formed outside the slot by using a surface processing method after forming the rugged polysilicon layer.

9. The method of claim 8 wherein the surface processing method is a chemical mechanical polishing method.

10. The method of claim 8 wherein the surface processing method is an etch back process.

11. The method of claim 1 wherein the resistivity of the load resistor is greater than $10^9$ ohm ($\Omega$).

* * * * *